United States Patent
Igura

(10) Patent No.: US 9,787,297 B2
(45) Date of Patent: Oct. 10, 2017

(54) SIGNAL GENERATOR, SIGNAL GENERATION METHOD, AND NUMERICALLY CONTROLLED OSCILLATOR

(71) Applicant: NEC CORPORATION, Tokyo (JP)

(72) Inventor: Hiroyuki Igura, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 20 days.

(21) Appl. No.: 14/647,471

(22) PCT Filed: Nov. 26, 2013

(86) PCT No.: PCT/JP2013/006931
§ 371 (c)(1),
(2) Date: May 27, 2015

(87) PCT Pub. No.: WO2014/091693
PCT Pub. Date: Jun. 19, 2014

(65) Prior Publication Data
US 2015/0311890 A1 Oct. 29, 2015

(30) Foreign Application Priority Data

Dec. 13, 2012 (JP) ................. 2012-272523

(51) Int. Cl.
*H03K 12/00* (2006.01)
*G06G 7/14* (2006.01)
(Continued)

(52) U.S. Cl.
CPC .............. *H03K 12/00* (2013.01); *G06G 7/14* (2013.01); *G06G 7/161* (2013.01); *G06G 7/26* (2013.01);
(Continued)

(58) Field of Classification Search
CPC ............ H03K 12/00; H03K 9/06; G06G 7/14; G06G 7/161; G06G 7/26; G06G 7/30; H03C 2200/0029
(Continued)

(56) References Cited

U.S. PATENT DOCUMENTS 5,479,449 A * 12/1995 Patel ...................... H04L 27/02
375/316
6,710,635 B1 * 3/2004 Wilson .................... H04L 27/38
327/113
(Continued)

FOREIGN PATENT DOCUMENTS

JP  7-175636 A   7/1995
JP  2998684 B2   1/2000
(Continued)

OTHER PUBLICATIONS

International Search Report for PCT/JP2013/006931 dated Mar. 4, 2014.

*Primary Examiner* — Brandon S Cole
(74) *Attorney, Agent, or Firm* — Sughrue Mion, PLLC

(57) ABSTRACT

A waveform conversion unit (42) of a numerically controlled oscillator has a cosine table (101) and a sine table (102) in which parameters for cosine wave and sine wave signal generation are stored, a correction mechanism (50) for generating correction values according to the phase of an inputted phase signal, an adder (111) for generating a cosine wave signal from a parameter in the cosine table (101) and a correction value, and an adder (112) for generating a sine wave signal from a parameter in the sine table (102) and a correction value. The correction mechanism (50) uses waveform data which is a kind of parabolic data and whose phase interval is more minute than the phase interval of the parameters in each table (101), (102) to generate correction values for correcting cosine wave and sine wave signals to be found by linear interpolation.

5 Claims, 13 Drawing Sheets

(51) Int. Cl.
*G06G 7/161* (2006.01)
*G06G 7/26* (2006.01)
*G06G 7/30* (2006.01)
*H03K 9/06* (2006.01)

(52) U.S. Cl.
CPC ................ G06G 7/30 (2013.01); H03K 9/06 (2013.01); *H03C 2200/0029* (2013.01)

(58) Field of Classification Search
USPC ..... 327/100–112, 379, 389, 391; 326/22–27, 326/81–87
See application file for complete search history.

(56) References Cited

U.S. PATENT DOCUMENTS

| | | | |
|---|---|---|---|
| 2004/0142667 A1* | 7/2004 | Lochhead | H03F 1/3247 455/114.3 |
| 2005/0160129 A1 | 7/2005 | Endo | |
| 2007/0024329 A1* | 2/2007 | Heidari | H03K 23/44 327/115 |
| 2009/0033378 A1* | 2/2009 | Petrovic | H03D 7/00 327/121 |
| 2009/0271132 A1* | 10/2009 | Furukawa | G01R 31/362 702/63 |
| 2010/0109715 A1 | 5/2010 | Zhang | |
| 2012/0187939 A1* | 7/2012 | Shinohara | G01R 33/072 324/207.2 |
| 2012/0275545 A1* | 11/2012 | Utsunomiya | H04L 27/368 375/297 |

FOREIGN PATENT DOCUMENTS

| | | |
|---|---|---|
| JP | 2000-252750 A | 9/2000 |
| JP | 2004-153376 A | 5/2004 |
| JP | 2005-208845 A | 8/2005 |
| JP | 2010-522496 A | 7/2010 |
| JP | 2011-193304 A | 9/2011 |

\* cited by examiner

SIGNAL GENERATOR, SIGNAL GENERATION METHOD, AND NUMERICALLY CONTROLLED OSCILLATOR

CROSS REFERENCE TO RELATED APPLICATIONS

This application is a National Stage of International Application No. PCT/JP2013/006931 filed Nov. 26, 2013, claiming priority based on Japanese Patent Application No. 2012-272523 filed Dec. 13, 2012, the contents of all of which are incorporated herein by reference in their entirety.

TECHNICAL FIELD

The present invention relates to a signal generator, a signal generation method, and a numerically controlled oscillator, particularly a signal generator, a signal generation method, and a numerically controlled oscillator which generate a signal by using a waveform table.

BACKGROUND ART

Conventionally, in wireless signal processing, processing is performed in which orthogonal demodulation processing is performed on an intermediate frequency signal (IF signal) to generate a baseband signal and orthogonal modulation processing is performed on a baseband signal to generate an intermediate frequency signal (IF signal) (refer to FIG. 1). Conventionally the orthogonal demodulation processing and the orthogonal modulation processing are performed by using an analog circuit. In recent years, as an LSI is speeded up, a case is increasing, in which the orthogonal demodulation processing and the orthogonal modulation processing are performed by using a digital circuit.

As shown in FIG. 2, in the orthogonal demodulation processing, an I-component of the baseband signal is generated by multiplying the intermediate frequency signal by a cosine wave signal, and a Q-component of the baseband signal is generated by multiplying that by a sine wave signal. As shown in FIG. 3, in the orthogonal modulation processing, an I-component of the baseband signal is multiplied by a cosine wave signal, a Q-component thereof is multiplied by a sine wave signal, and the two signals are added to generate the intermediate frequency signal.

In order to perform the orthogonal demodulation processing and the orthogonal modulation processing by the digital circuit, a numerically controlled oscillator (NCO) which simultaneously generates the cosine wave signal and the sine wave signal is required.

The numerically controlled oscillator normally includes a phase generation unit and a waveform conversion unit (refer to FIG. 4). The phase generation unit generates a time varying phase of a sine wave and a cosine wave to be generated by the waveform conversion unit. The waveform conversion unit converts a phase inputted from the phase generation unit into a sine value and a cosine value corresponding thereto and outputs as a sine wave signal (sin (wt)) and a cosine wave signal (cos (wt)). Since a circuit scale of the waveform conversion unit is large in such numerically controlled oscillator, a configuration thereof is important to save the circuit scale.

For conventional mounting of the waveform conversion unit, four types of methods described below are mainly used.
1. Waveform Table System (e.g. Patent Literatures 1, 2, and 3, Etc.)

The method for calculating a sine value and a cosine value by using a waveform table stored in ROM (Read Only Memory). The feature is to enable high-speed processing.
2. Linear Interpolation System (e.g. Patent Literature 1, Etc.)

The method for adding linear interpolation to the waveform table described above. The ROM table can be decreased compared with the waveform table system. FIG. 14 is a diagram illustrating a waveform conversion unit of a conventional numerically controlled oscillator to which the linear interpolation system is applied. As shown in FIG. 14, a conventional waveform conversion unit 1342 includes a cosine table 1301, a sine table 1302, dividers 1303, 1304, multipliers 1305, 1306, and adders 1307, 1308. The cosine table 1301 and the sine table 1302 store parameters to generate a cosine wave signal and a sine wave signal at a predetermined phase interval, respectively, and a signal of a phase interval which is smaller than the predetermined phase interval is calculated by linear interpolation.
3. CORDIC System (e.g. Patent Literature 4, Etc.)

The method for calculating a coordinate by gradually approaching a target angle by using a difference table of an orthogonal coordinate system. The feature is a small error.
4. Maclaurin Expansion System The method for directly calculating a cosine wave and a sine wave using a high-order formula in which Maclaurin expansion is performed with respect to a trigonometric function.

CITATION LIST

Patent Literature

[Patent Literature 1] Japanese Patent Application Laid-Open No. 2000-252750
[Patent Literature 2] Japanese Patent Application Laid-Open No. 2011-193304
[Patent Literature 3] Japanese Patent No. 2998684
[Patent Literature 4] Japanese Patent Application Laid-Open No. 2004-153376

SUMMARY OF INVENTION

Technical Problem

However the waveform table system includes a problem that as the number of points increases, the waveform table increases and the circuit scale is enlarged. A method is proposed in which the table is decreased by dividing 360 degrees ($2\pi$ radian) phase section into eight pieces and by converting an inputted phase and output data in order to reduce the waveform table. Even though the method is employed, there is a problem that the waveform table becomes quite large if accuracy is improved.

In the CORDIC system, since repeated calculations are required, processing time is increased. In the Maclaurin expansion system, since high-order multiplication is required in order to improve accuracy, the processing time and the circuit scale also are increased. As described above, the CORDIC system and the Maclaurin expansion system have the problem that the processing time gets increased, and are not frequently employed.

In the linear interpolation system, a multiplier to add linear interpolation is necessary and an error is increased when an interval of interpolation is widened. The system is, however, a relatively well-balanced method in processing speed and the circuit scale. Therefore, traditionally, the linear interpolation system is frequently employed. However the linear interpolation system has the problem that an error is large. A high-order interpolation method, like a second-order interpolation and a spline interpolation, may be employed in order to solve the problem. Since a multiplier with a large bit width is required when the high-order interpolation method is simply applied, the circuit scale is increased.

The invention is made to solve the problem, and has an object to provide a signal generator, a signal generation method, and a numerically controlled oscillator which can suppress increase of the circuit scale while reducing an error.

Solution to Problem

A signal generator of the invention includes: a first parameter table for storing a parameter to generate a first frequency signal; a second parameter table for storing a parameter to generate a second frequency signal that differs in a phase from the first frequency signal; correction value generation unit, that a phase signal generated at a first phase interval is inputted to, for generating first and second correction values correcting the first and the second frequency signals in accordance with a phase indicated by the phase signal, respectively; first signal generation unit for generating the first frequency signal of the first phase interval on the basis of the phase signal, the parameter of the first parameter table, and the first correction value generated by the correction value generation unit; and a second signal generation unit for generating the second frequency signal of the first phase interval on the basis of the phase signal, the parameter of the second parameter table, and the second correction value generated by the correction value generation unit.

A signal generation method of the invention is a method for generating a first frequency signal and a second frequency signal that differs in a phase from the first frequency signal, the method includes:

a correction value generation step of inputting a phase signal generated at a first phase interval and generating first and second correction values correcting the first and the second frequency signals in accordance with a phase indicated by the phase signal, respectively;

a first signal generation step of generating the first frequency signal of the first phase interval on the basis of the phase signal, a parameter to generate the first frequency signal, and the first correction value generated in the correction value generation step; and a second signal generation step of generating the second frequency signal of the first phase interval on the basis of the phase signal, a parameter to generate the first frequency signal, and the second correction value generated in the correction value generation step, wherein the first and the second correction values are generated by using one parabolic waveform data in the correction value generation step.

A numerically controlled oscillator of the invention includes:

phase signal generation unit for generating a phase signal at a first phase interval, and a signal generation unit for generating a first frequency signal and a second frequency signal that differs in a phase from the first frequency signal on the basis of the phase signal; wherein the signal generation unit includes a first parameter table for storing a parameter to generate the first frequency signal, a second parameter table for storing a parameter to generate the second frequency signal, correction value generation unit, that a phase signal generated by the phase signal generation unit is inputted to, for generating first and second correction values correcting the first and the second frequency signals in accordance with a phase indicated by the phase signal, respectively, first signal generation unit for generating the first frequency signal of the first phase interval on the basis of the phase signal, the parameter of the first parameter table, and the first correction value generated by the correction value generation unit, and a second signal generation unit for generating the second frequency signal of the first phase interval on the basis of the phase signal, the parameter of the second parameter table, and the second correction value generated by the correction value generation unit.

Advantageous Effects of Invention

According to the invention, the signal generator, the signal generation method, and the numerically controlled oscillator which suppress the circuit scale while reducing an error can be provided.

DESCRIPTION OF EMBODIMENTS

A specific embodiment to which the invention is applied is described in detail by referring to drawings. As described above, the numerically controlled oscillator with the conventional configuration includes disadvantages, such as slow processing speed, a large circuit scale, and a large operation error. To the contrary, in the numerically controlled oscillator of the embodiment of the invention, when correction is added to the conventional numerically controlled oscillator of the linear interpolation system by using a common parabola table, the operation error is reduced.

The numerically controlled oscillator of the embodiment is used for a wireless signal processing unit (wireless signal processing circuit) or the like performing orthogonal demodulation processing and orthogonal modulation processing using a digital circuit. Initially, examples of a wireless signal processing unit, an orthogonal demodulation processing unit, and an orthogonal demodulation processing unit are described prior to the numerically controlled oscillator of an embodiment 1.

Figure 1:
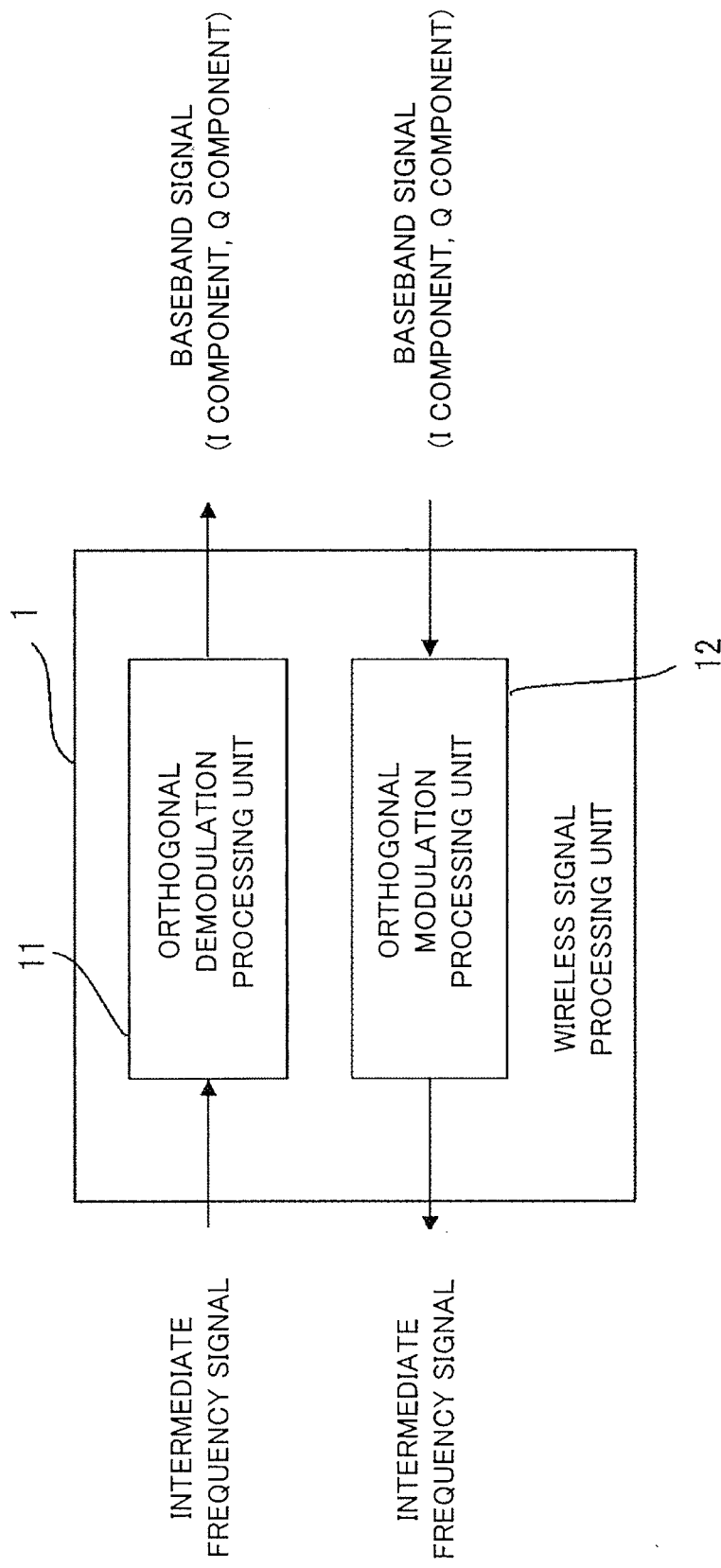
FIG. 1 is a diagram illustrating one example of a common wireless signal processing unit.

FIG. 1 is a diagram illustrating one example of a common wireless signal processing unit. As shown in FIG. 1, a wireless signal processing unit 1 includes an orthogonal demodulation processing unit 11 and an orthogonal modulation processing unit 12. The orthogonal demodulation processing unit 11 receives an intermediate frequency signal and outputs an I-component and a Q-component of a baseband signal. Conversely, the orthogonal modulation processing unit 12 receives an I-component and a Q-component of a baseband signal and outputs them as an intermediate frequency signal.

Figure 2:
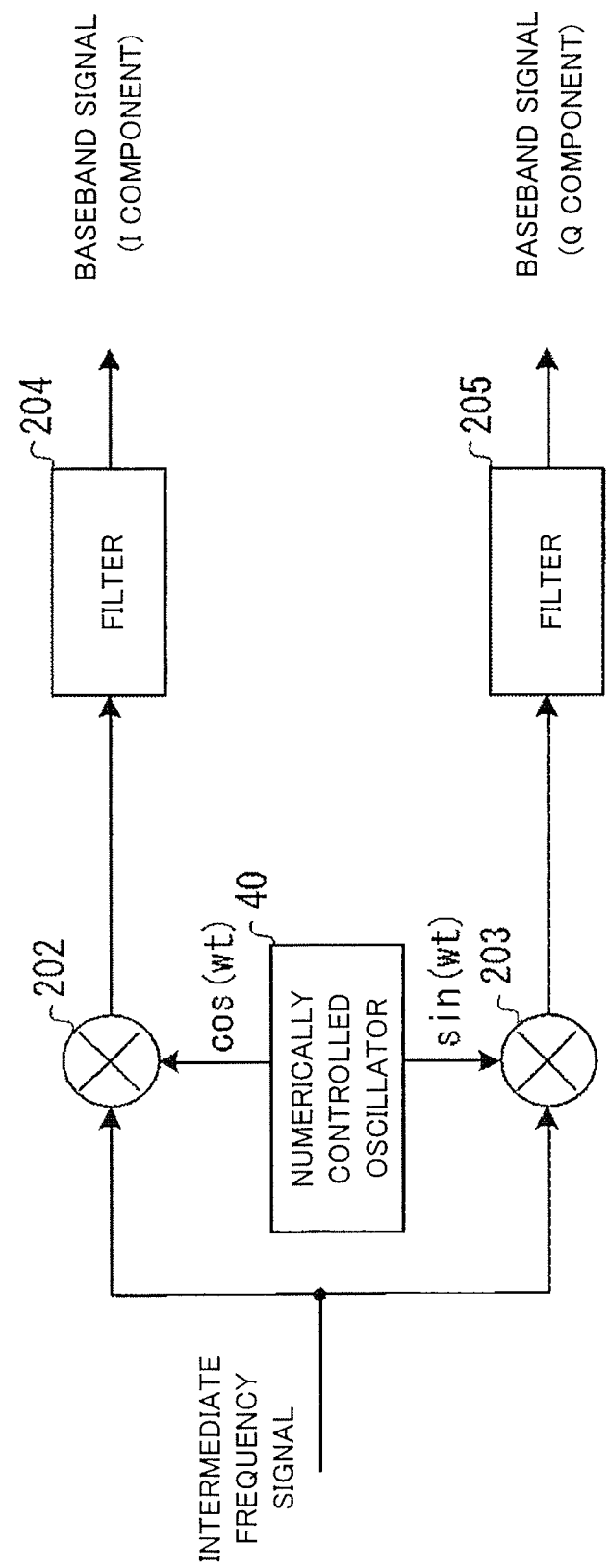
FIG. 2 is a diagram illustrating one example of an orthogonal demodulation processing unit.
Figure 3:
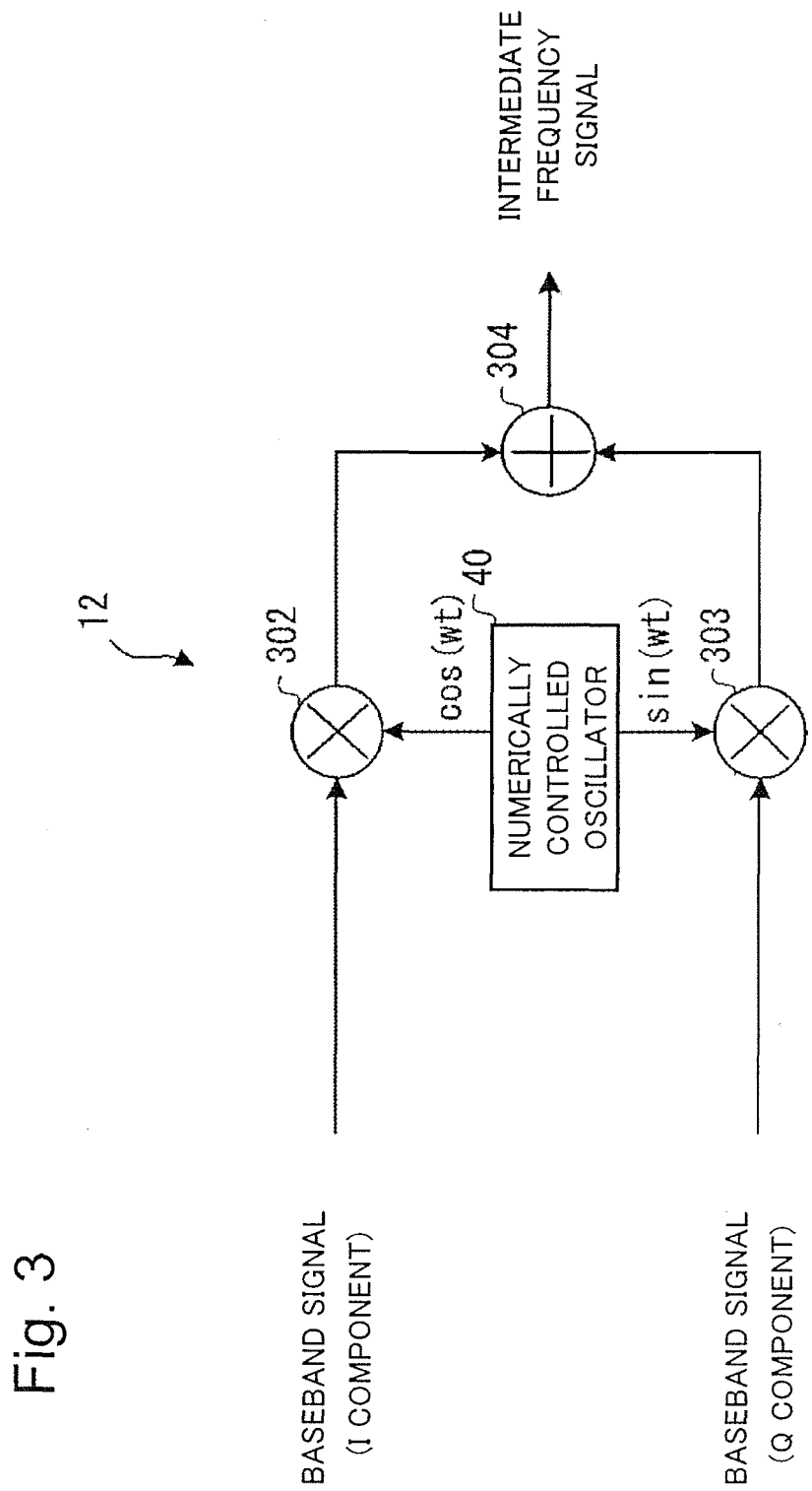
FIG. 3 is a diagram illustrating one example of an orthogonal modulation processing unit.

FIG. 2 and FIG. 3 are diagrams illustrating examples of the orthogonal demodulation processing unit 11 and the orthogonal modulation processing unit 12, respectively. As shown in FIG. 2, the orthogonal demodulation processing unit 11 includes multipliers 202, 203, filters 204, 205, and a numerically controlled oscillator 40. The intermediate frequency signal to be inputted is inputted into the multipliers 202, 203. The multiplier 202 multiplies the intermediate frequency signal by a cosine wave signal cos (wt) inputted from the numerically controlled oscillator 40 and the filter 204 outputs the multiplication result as the I-component of the baseband signal. The multiplier 203 multiplies the intermediate frequency signal by a sine wave signal sin (wt) inputted from the numerically controlled oscillator 40 and the filter 205 outputs the multiplication result as the Q-component of the baseband signal.

As shown in FIG. 3, the orthogonal modulation processing unit 12 includes multipliers 302, 303, an adder 304, and a numerically controlled oscillator 40. In the an orthogonal modulation processing unit 12, the I-component and the Q-component of the baseband signal are inputted into the multipliers 302, 303, respectively. The multiplier 302 multiplies the I-component of the baseband signal by a cosine wave signal cos (wt) inputted from the numerically controlled oscillator 40 and outputs. The multiplier 303 multiplies the Q-component of the baseband signal by a sine wave signal sin (wt) inputted from the numerically controlled oscillator 40 and outputs. The adder 304 adds the multiplication results of the multipliers 302, 303, and outputs as an intermediate frequency signal.

Figure 4:
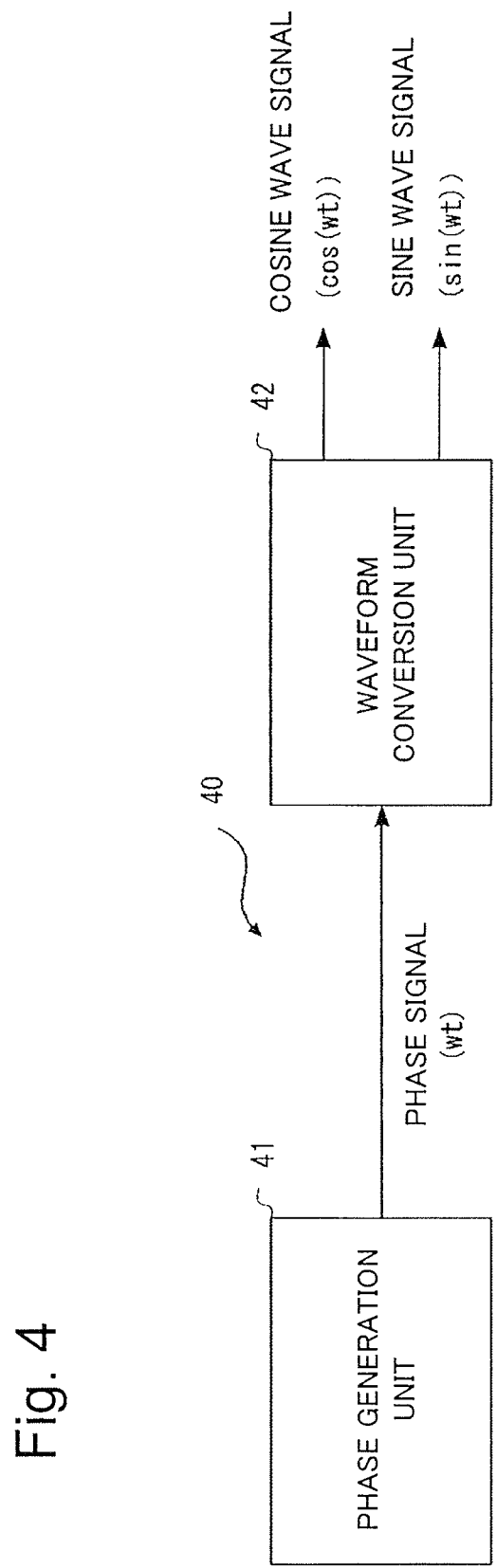
FIG. 4 is a diagram illustrating a numerically controlled oscillator of an embodiment 1 of the invention.

FIG. 4 is a diagram illustrating a numerically controlled oscillator of an embodiment 1 of the invention. As shown in FIG. 4, the numerically controlled oscillator 40 includes a phase generation unit 41 and a waveform conversion unit 42 as a signal generation device. The configuration thereof is just like that of the conventional one. The phase generation unit 41 generates a time varying phase of a sine wave and a cosine wave to be generated by the waveform conversion unit 42 and outputs to the waveform conversion unit 42 as a phase signal. The waveform conversion unit 42 converts a phase inputted from the phase generation unit 41 into a corresponding sine value and a corresponding cosine value and outputs as a sine wave signal (sin (wt)) and a cosine wave signal (cos (wt)).

Figure 5:
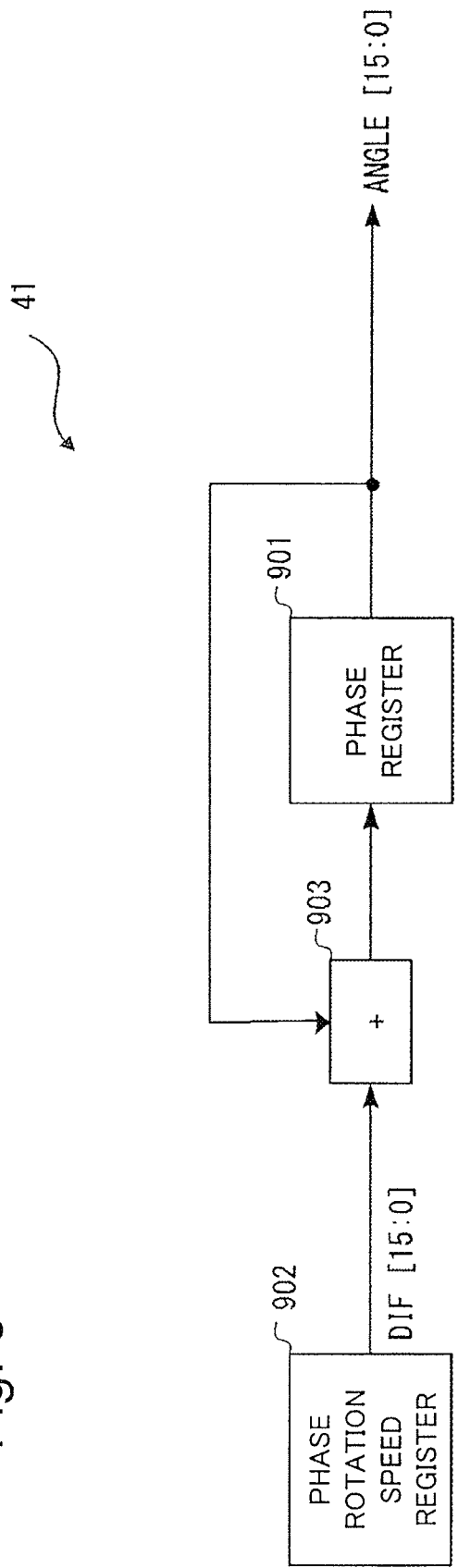
FIG. 5 is a block diagram illustrating a phase generation unit of the embodiment 1 of the invention.

FIG. 5 is a block diagram illustrating the phase generation unit of the embodiment. As shown in FIG. 5, the phase generation unit 41 includes a phase register 901, a phase rotation speed register 902 and an adder 903. In the phase generation unit 41, the phase register 901 stores a current phase value (DIF), the adder 903 stores a phase rotation speed value stored in the phase rotation speed register 902 and the current phase value, and stores in the phase register 901 in a next cycle. The phase register 901 outputs a phase signal (ANGLE) of a phase value to which the amount of the phase rotation speed value is added in order at each timing. The phase register 901 is a register with a bit width in which 360 degrees (2π radian) circulation returns to zero degree (zero radian), and, for example, the bit width of it can be set to 16 bits ([15:0]).

Embodiment 1: Configuration of Waveform Conversion Unit

Figure 6:
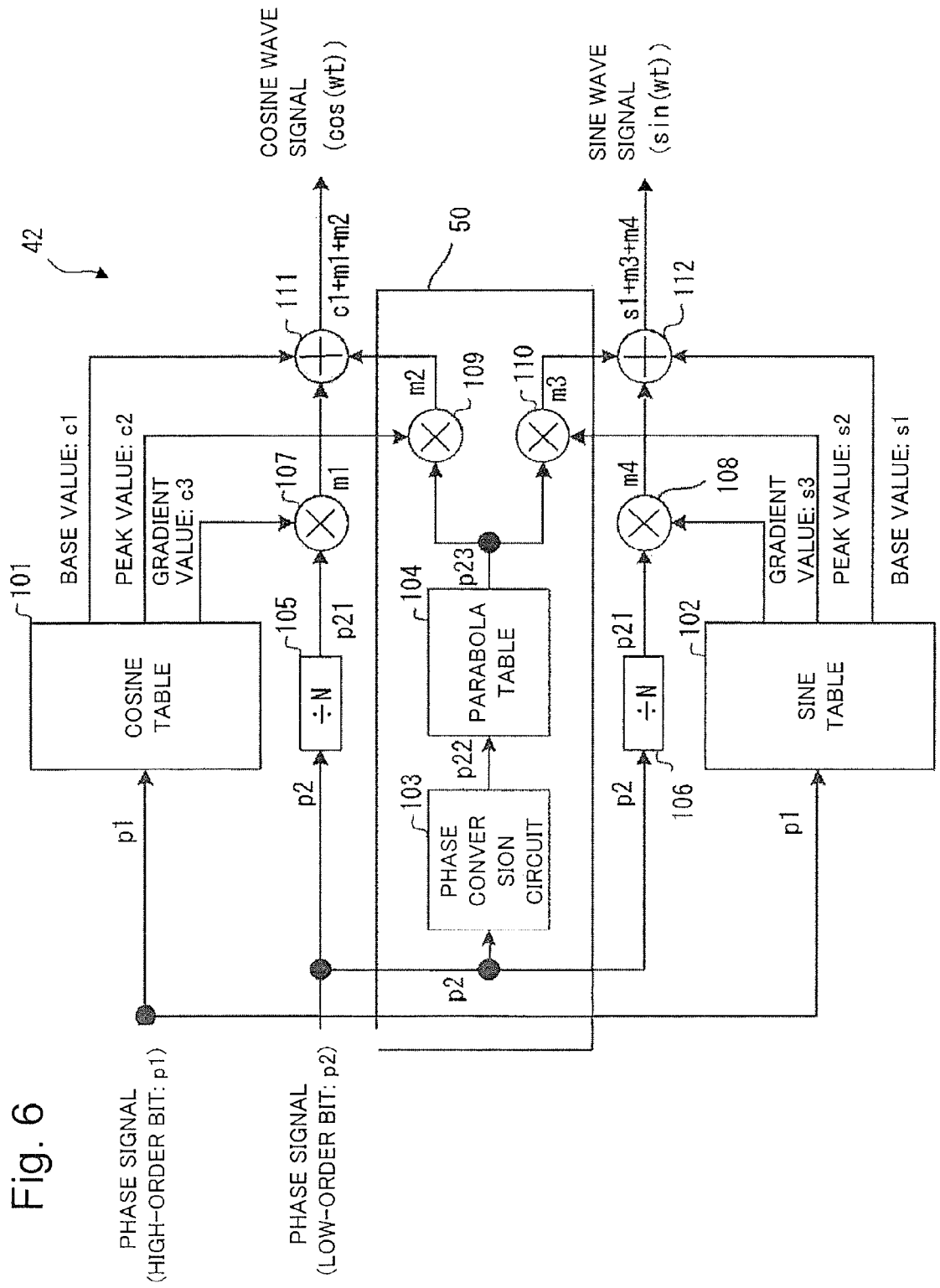
FIG. 6 is a diagram illustrating a waveform conversion unit of the numerically controlled oscillator of the embodiment 1 of the invention.

FIG. 6 is a diagram illustrating a waveform conversion unit of the numerically controlled oscillator of the embodiment 1 of the invention. As shown in FIG. 6, a waveform conversion unit 42 of the numerically controlled oscillator 40 of the embodiment includes a cosine table 101 which is a first parameter table which stores a parameter to generate a cosine wave signal as a first frequency signal, and a sine table 102 which is a second parameter table which stores a parameter to generate a sine wave signal as a second frequency signal which differs in a phase from the cosine wave signal.

Further the waveform conversion unit 42 includes a correction mechanism 50 which is a correction value generation unit receiving a phase signal generated at a first phase interval, and generating first and second correction values which correct the sine wave signal and the cosine wave signal in accordance with the phase indicated by the phase signal, respectively. Further the waveform conversion unit 42 includes an adder 111 which is a first signal generation unit generating the cosine wave signal of the first phase interval on the basis of the phase signal, a parameter of the cosine table 101, and the first correction value generated by the correction mechanism 50, and an adder 112 which is a second signal generation unit generating the sine wave signal of the first phase interval on the basis of the phase signal, a parameter of the sine table 102, and the second correction value generated by the correction mechanism 50. Further the waveform conversion unit 42 includes dividers 105, 106, and multipliers 107, 108. The correction mechanism 50 includes a phase conversion circuit 103, a parabola (waveform) table 104, and a multiplier 109 and a multiplier 110 as first-and-second-correction-value output unit, respectively.

Figure 14:
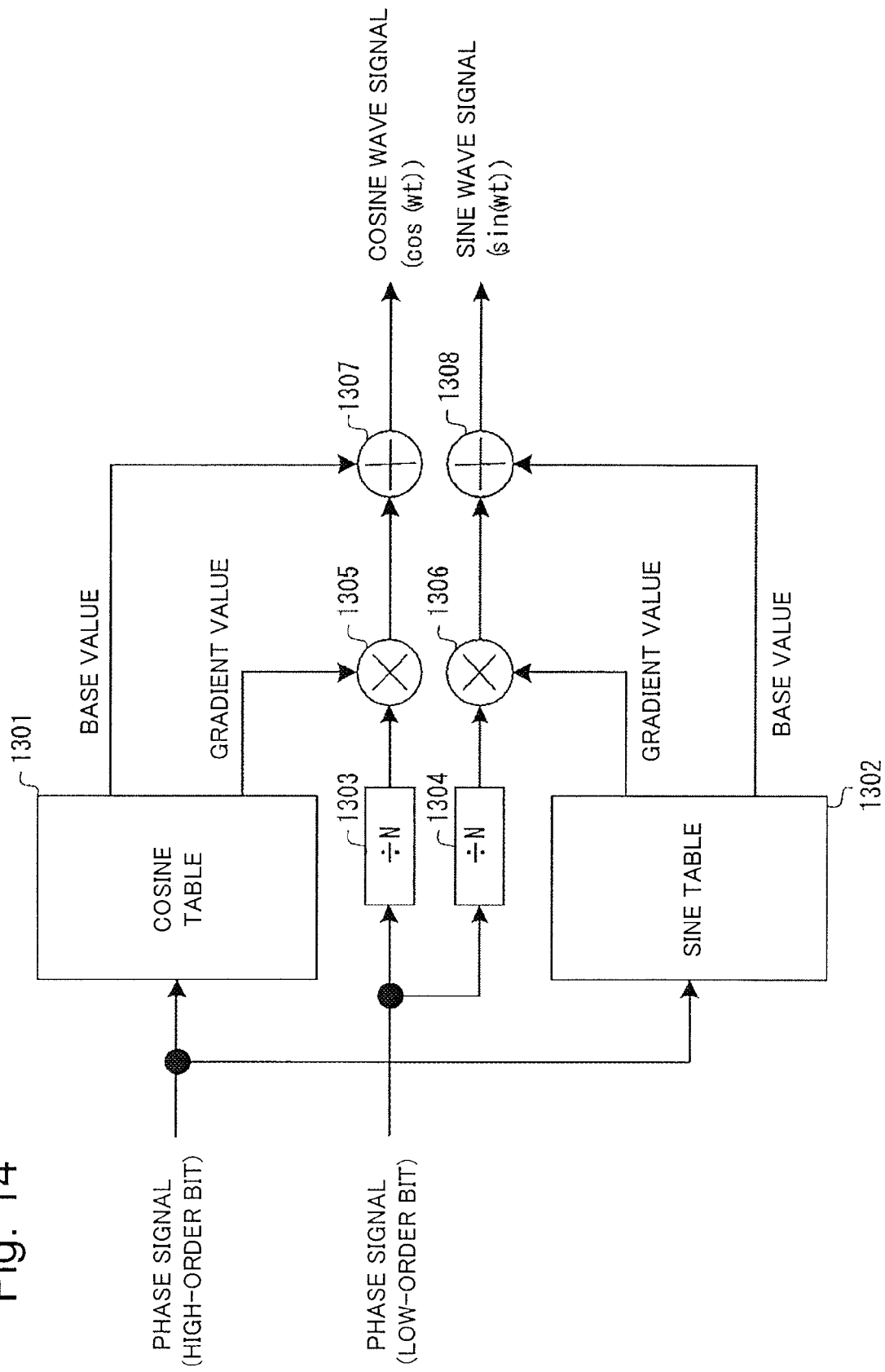
FIG. 14 is a diagram illustrating a waveform conversion unit of a numerically controlled oscillator to which a conventional linear interpolation system is applied.

As described above, a high-order bit and a low-order bit of the phase signal are separately inputted to the waveform conversion unit 42 from the phase generation unit 11, and the waveform conversion unit 42 generates and outputs the cosine wave signal and the sine wave signal corresponding to a phase value of the phase signal. Compared with the wave conversion unit of the numerically controlled oscillator with the conventional linear interpolation system of FIG. 14, the correction mechanism 50 including the phase conversion circuit 103, the parabola table 104, and the multipliers 109 and 110 is added, and the cosine table 101 and the sine table 102 hold a peak value in addition to a base value, a gradient value described below. The correction mechanism 50 generates a correction value to correct the sine wave and the cosine wave signal using the peak value.

Figure 7:
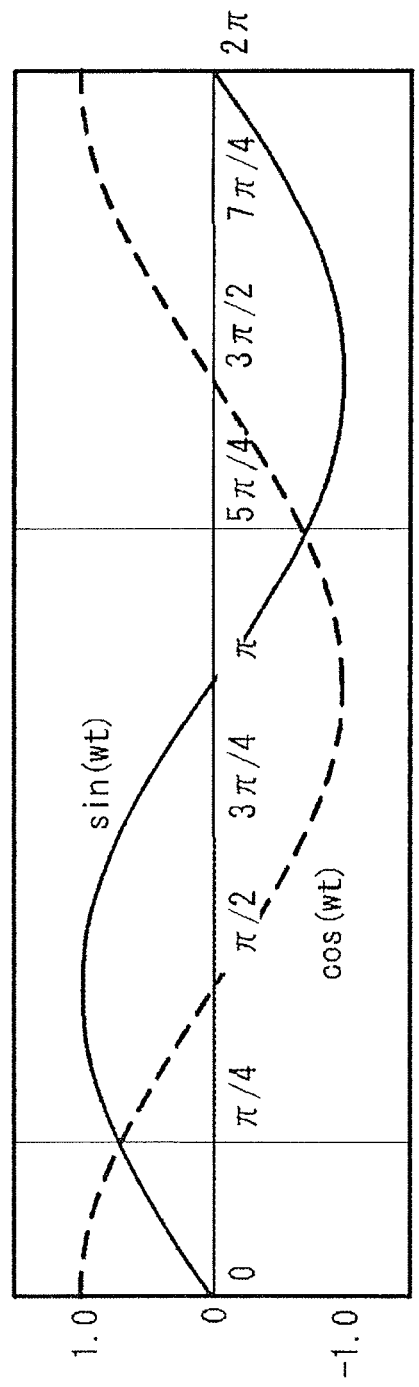
FIG. 7 is a diagram illustrating a cosine wave signal cos (wt) and a sine wave signal sin (wt) which are generated in the waveform conversion unit.

Each configuration is further explained below in detail. FIG. 7 is a diagram illustrating the cosine wave signal cos (wt) and the sine wave signal sin (wt) which are generated in the waveform conversion unit 42. As shown in FIG. 7, the cosine wave signal cos (wt) and the sine wave signal sin (wt) each include the $2\pi$ radian period and are waveform signals whose phases are different by $(3/2)\pi$ radian from each other.

In this embodiment, the phase signal is represented by dividing a 360 degrees ($2\pi$ radian) section which is a unit of a single period of the cosine wave signal cos (wt) and the sine wave signal sin (wt) by a power of two. For example, if the 360 degrees ($2\pi$ radian) section is divided by the sixteenth power of two, zero degree is represented as 0, and 180 degrees are represented as 32768. In this case, if the phase signal is represented by a binary number and is divided into low-order 8 bits and high-order 8 bits, the inputted phase signal can be represented as high-order 8 bits×256+low-order 8 bits. In this case, the high-order 8 bits of the phase signal represent a phase space which ranges from high-order 8 bits×256 to high-order 8 bits×256+255.

The cosine table 101 stores a first parameter to a third parameter (base value, peak value and gradient value) on the cosine wave signal. The base value, the peak value and the gradient value of the cosine wave corresponding to a phase value represented by the high-order bit of the phase signal are outputted to the adder 111, the multiplier 109 and the multiplier 107, respectively. The sine table 102 stores a first parameter to a third parameter (base value, peak value and gradient value) on the sine wave signal. Like the cosine table 101, the base value, the peak value and the gradient value of the sine wave corresponding to a phase value represented by the high-order bit of the phase signal are outputted to the adder 112, the multiplier 110 and the multiplier 108, respectively.

The cosine table 101 and the sine table 102 hold parameters to generate the cosine wave signal and the sine wave signal at an interval (second phase interval) G2 which is larger than the phase interval (first phase interval) G1 of the phase signal generated by the phase generation unit 41, respectively.

Figure 8:
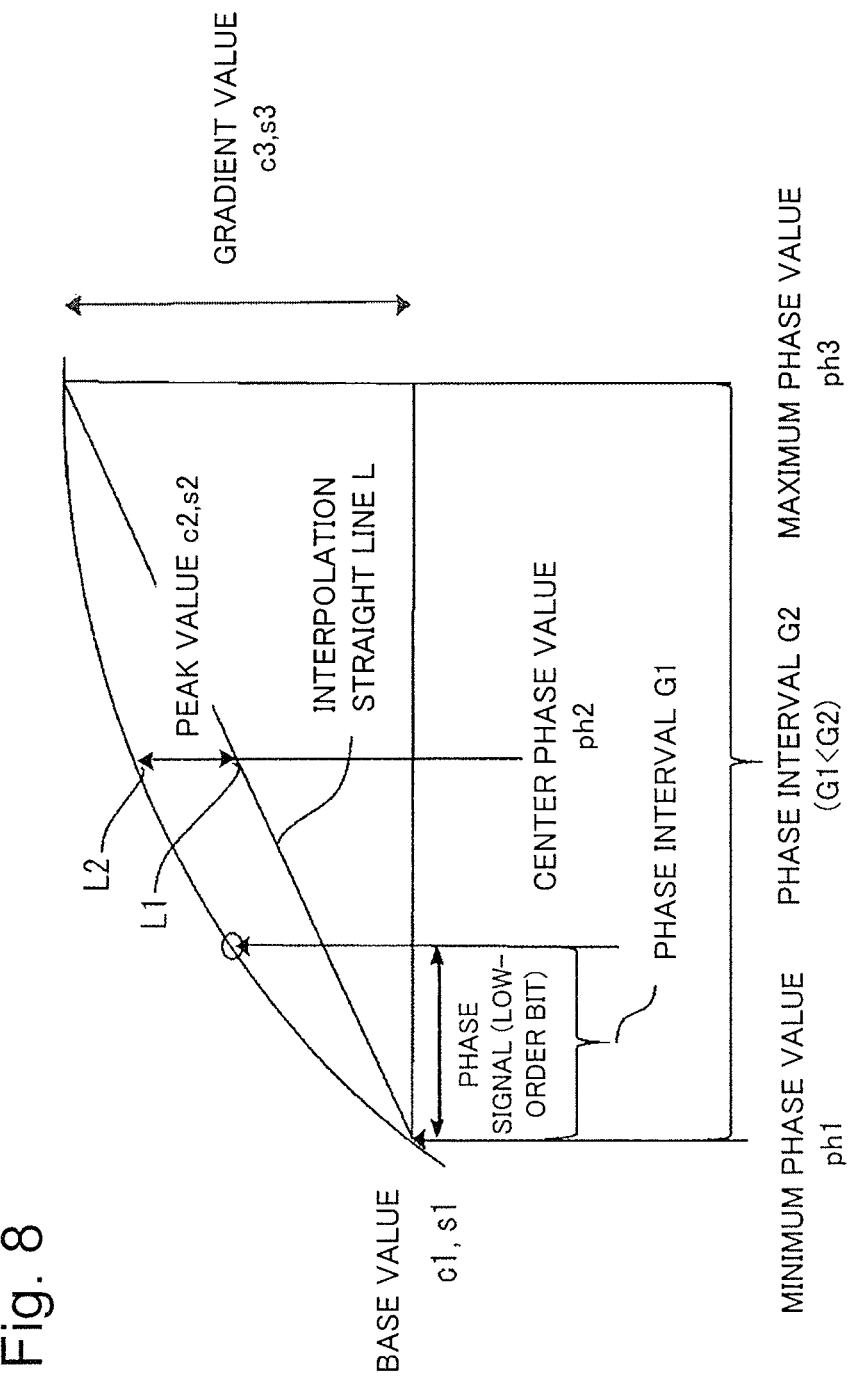
FIG. 8 is a diagram explaining a base value, a peak value, and a gradient value.

FIG. 8 is a diagram explaining the base value, the peak value and the gradient value. As shown in FIG. 8, the parameters stored in the cosine table 101 and the sine table 102 represent features of a waveform in each phase section.

Base values c1, s1 represent values of the cosine wave signal and the sine wave signal (height at left end) at the minimum phase value ph1 of the phase section of the phase interval G2, respectively. Gradient values c2, s2 represent a difference between values of the cosine wave signal at the minimum phase value ph1 of the phase section (base value) and at the maximum phase value ph3 (height at right end) thereof and a difference between values of the sine wave signal at the minimum phase value ph1 (base value) of the phase section and at the maximum phase value ph3 (height at right end) thereof, respectively. Peak values c3, s3 represent a difference between a value L1 at the central phase value ph2 of the center of the phase section on the interpolation straight line which connects the minimum phase value and the maximum phase value and a value L2 of the wave of the real cosine wave at the central phase value ph2 thereof, and a difference between a value L1 at the central phase value ph2 of the center of the phase section on the interpolation straight line which connects the minimum phase value and the maximum phase value and a value L2 of the wave of the real sine wave at the central phase value ph2 thereof, respectively. In the conventional linear interpolation system, when the cosine wave signal and the sine wave signal in the phase section of the phase interval G2 are calculated, a value on the interpolation straight line L on the basis of the linear interpolation is used. In the embodiment, the peak values c3, s3 at the central phase value ph2 are converted to peak values corresponding to phase values in the phase section of the phase interval G2 and added. The amount of the conversion value of the peak value parameter corresponds to the amount of improvement from a value of the conventional linear interpolation. These parameters use numeric representation representing numbers after the decimal point.

Figure 9:
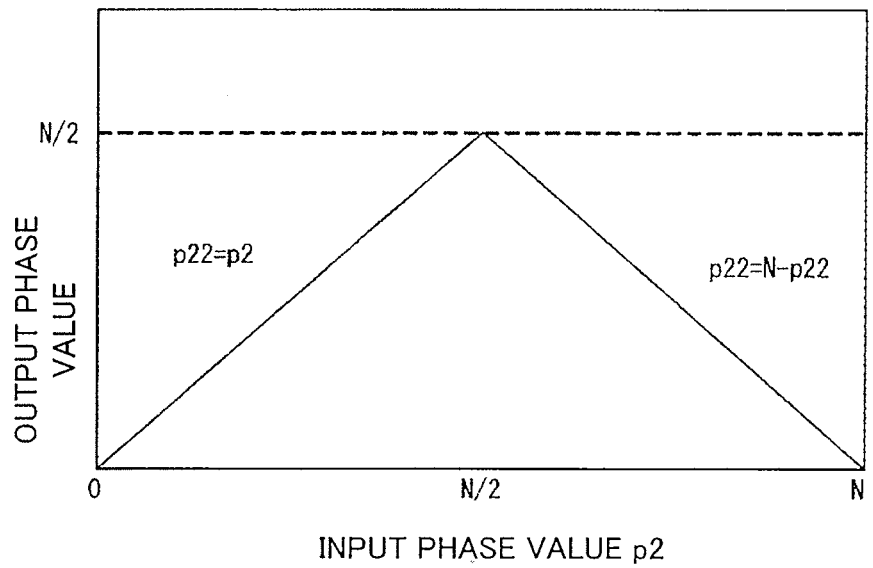
FIG. 9 is a graph illustrating a relationship between an input phase signal p2 of the phase conversion circuit and an output phase signal p22 thereof.

The phase conversion circuit 103 receives the low-order bit of the phase signal and converts the phase value represented by the low-order bit into a value corresponding to the phase of the parabolic waveform data included in the parabola table 104. FIG. 9 is a graph illustrating a relationship between an input phase signal p2 of the phase conversion circuit 103 and an output phase signal p22 thereof. In the conversion in the phase conversion circuit 103, if a bit number of the low-order bit of the phase signal is n, a phase which can be designated by the low-order bit of the phase signal is the n-th power of two. If the n-th power of two is N, when the input phase signal is smaller than N/2, the value is outputted as the output phase signal p22 (=p2) as it is, and when the input phase signal p2 is equal to or larger than N/2, the value of N minus the value of the input phase signal is outputted as the output phase signal p22 (=N−p2).

Figure 10:
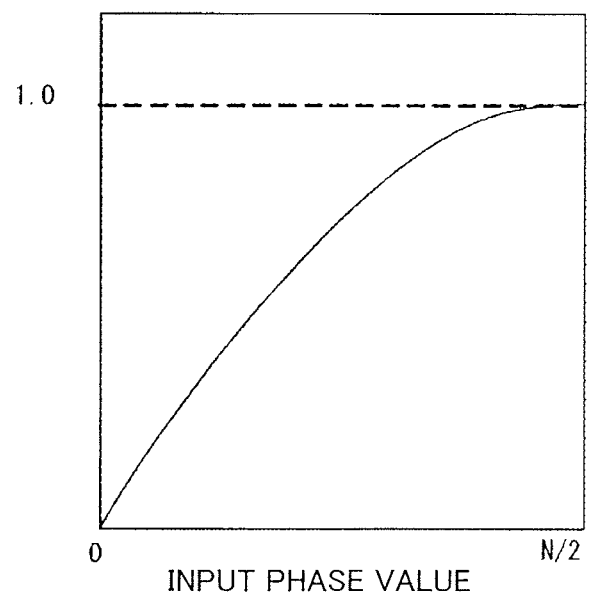
FIG. 10 is a graph illustrating a parabolic waveform.

The parabola table 104 stores waveform data which is a laterally symmetrical parabolic waveform and whose phase interval is at least smaller than the second phase interval G2. Since the parabolic waveform is laterally symmetrical, the left half only has to be stored. FIG. 10 is a graph illustrating the parabolic waveform. The parabola table 104 stores the left half of the laterally symmetrical parabolic waveform which ranges from 0 to 1 in the vertical axis and from 0 to N in the horizontal axis, that is, the parabolic waveform data which ranges from 0 to N/2, and which is at least smaller than the second phase interval G2. Here, the parabolic waveform data is stored at the interval of the phase interval G1 of the phase signal generated by the phase generation unit 41. The phase interval G1 can be, for example, a phase interval G2/256, etc.

The dividers 105, 106 convert the low-order bit of the phase signal into a value from 0 to 1. The multiplier 107 multiplies the gradient value c3 of the cosine wave outputted from the cosine table 101 and the low-order bit p2 of the phase signal outputted from the multiplier 105 together. The multiplier 108 multiplies the gradient value s3 of the sine wave outputted from the cosine table 102 and the low-order bit p2 of the phase signal outputted from the multiplier 106 together.

The multiplier 109 multiplies the peak value c3 of the cosine wave outputted from the cosine table 101 and parabolic data p23 which is read out from the parabola table 104 together. The multiplier 110 multiplies the peak value s2 of the sine wave outputted from the sine table 102 and the parabolic data p23 which is read out from the parabola table 104 together.

The adder 111 adds the base value c1 of the cosine wave outputted from the cosine table 101, an output value m1 of the multiplier 107 and an output value (first correction value) m2 of the multiplier 109 to generate the cosine wave signal cos (wt). The adder 112 adds the base value s1 of the sine wave outputted from the sine table 102, an output value m4 of the multiplier 108, and an output value (second correction value) m3 of the multiplier 110 to generate the sine wave signal sin (wt).

In the waveform conversion unit 42 of the embodiment, a numerically controlled oscillator which has high operation accuracy while suppressing increase of a circuit scale and process delay can be made by adding the correction mechanism 50 calculating the correction values m3, m4 in which the parabolic data p23 is multiplied by the peak values c2, S2, respectively, to the conventional linear interpolation type waveform conversion unit, when the cosine wave signal cos (wt) and the sine wave signal sin (wt) are generated.

Embodiment 1: Operation of Waveform Conversion Unit

Next an operation of the waveform conversion unit 42 of the numerically controlled oscillator 1 of the embodiment is explained. When being inputted to the waveform conversion unit 42, a phase signal p0 generated by the phase generation unit 41 is decomposed into the high-order bit p1 and the low-order bit p2.

Three types of parameters, the base value (base value parameter) c1, the peak value (peak value parameter) c2 and the gradient value (gradient value parameter) c3 in the phase section are read out from the cosine table 101 using the high-order bit p1 of the phase signal which is acquired by dividing the phase signal. Similarly, the three types of parameters, the base value s1, the peak value s2 and gradient value s3 in the phase section are read out from the sine table 102.

The low-order bit of the phase signal (input phase signal) p2 is converted into the output phase signal p22 using the phase conversion circuit 103. Using the phase signal converted by the phase conversion circuit 103 (output phase signal), the parabolic data p23 corresponding to the phase thereof is acquired from the parabola table 104.

The multiplier 109 multiplies the parabolic data p23 read out from the parabola table 104 and the peak value c2 for a cosine wave read out from the cosine table 101 together to acquire the correction value m2. The multiplier 110 multiplies the parabolic data p23 read out from the parabola table 104 and the peak value s2 for a sine wave read out from the sine table 102 together to acquire the correction value m3. In this case, by employing the same parabolic data p23 for the cosine wave and the sine wave, the correction values m2, m3 are acquired. Since the parabola table 104 is shared, the table size is reduced.

In the divider 105, the low-order bit p2 of the phase signal is divided by the number of data N in the phase section to be converted into a value p21 from 0 to 1. The multiplier 107 multiplies the value p21 converted by the divider 105 by the gradient value c3 read out from the cosine table 101. In this case, since the phase section is a power of two and the phase signal is divided by the power of two, the divider 105 is actually unnecessary.

Similarly the divider 106 converts the low-order bit p21 of the phase signal into a value p21 between 0 to 1, and the multiplier 108 multiplies the value p21 converted by the divider 106 and the gradient value s3 read out from the sine table 102 together. In this case, the divider 106 is actually unnecessary, like the time of generation of the cosine wave signal.

The adder 111 adds the base value c1 read out from the cosine table 101, a multiplication result m1 of the multiplier 107 and the correction value m3 from the divider 109 (c1+m1+m3) to generate the cosine wave signal cos (wt). Similarly the adder 112 adds the base value s1 read out from the sine table 102, a multiplication result m2 of the multiplier 108 and the correction value m4 from the divider 110 (s1+m2+m4) to generate the sine wave signal sin (wt). The above process makes it possible to generate the cosine wave signal and the sine wave signal from the phase signal.

In the embodiment, when the sine wave and the cosine wave are generated, a value of the parabola table 104 which has a fine sample interval is used and a correction value is added to a value in which parameters of the cosine table 101 and the sine table 102 having a coarse sample interval is linear-interpolated at the coarse sample interval to correct a interpolation value. Thereby, when the parameter interval of the parameters of the cosine table 101 and the sine table 102 is made to be the same as the conventional simple linear interpolation, an operation error can be decreased since correction is performed using the correction value. If accuracy is similar to that of the conventional linear interpolation, since the parabola table 104 is shared for the cosine wave and the sine wave in common, the circuit scale of the numerically controlled oscillator 40 can be reduced.

Embodiment 2: Another Example of Waveform Conversion Unit

Figure 11:
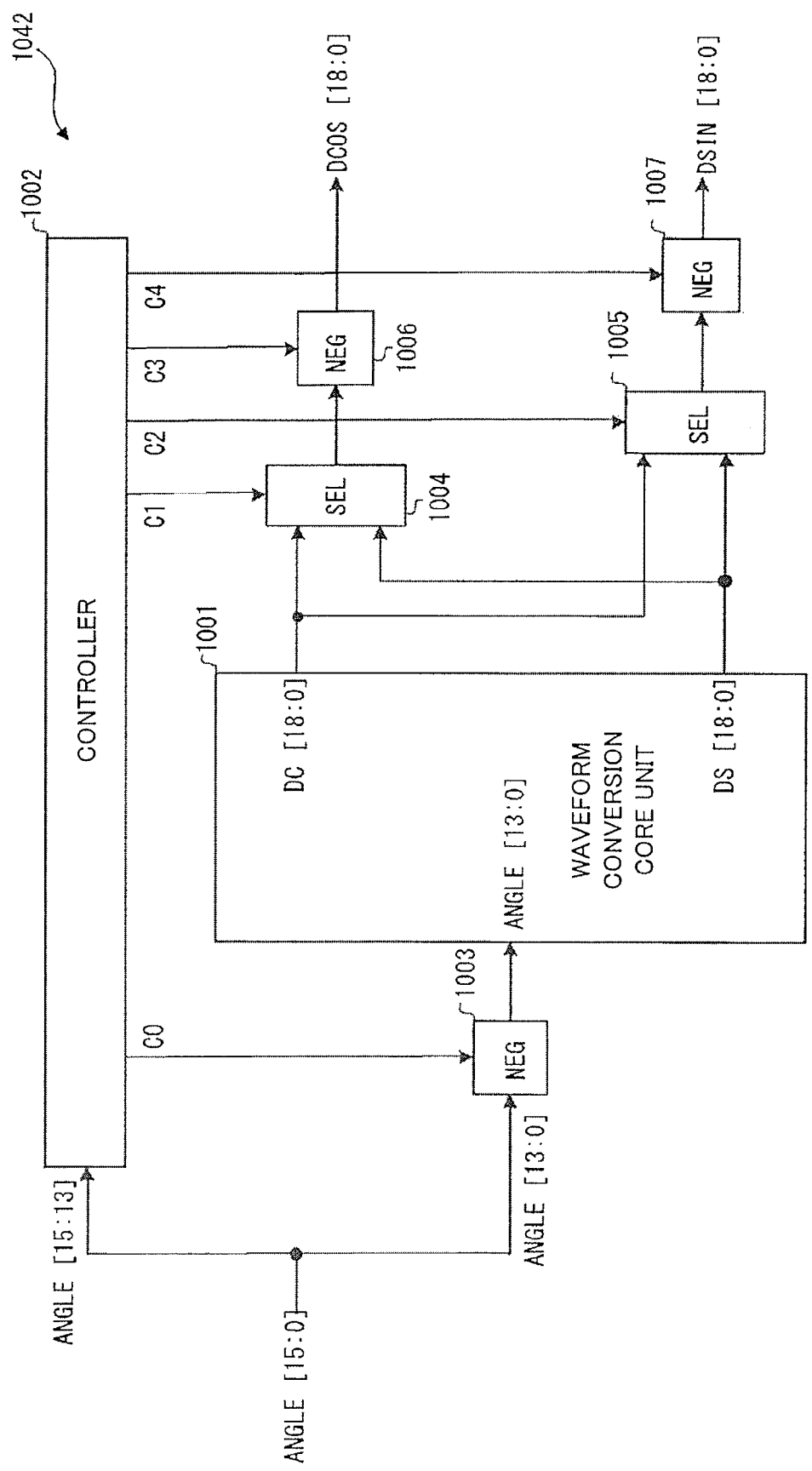
FIG. 11 is a block diagram illustrating one specific example of a waveform conversion unit of a numerically controlled oscillator of a second embodiment 2 of the invention.

Next a numerically controlled oscillator of the embodiment 2 of the invention is explained. Elements which are the same as those of the numerically controlled oscillator of the embodiment 1 shown in FIG. 1 to FIG. 10 have the same sign and detailed descriptions thereof are omitted. FIG. 11 is a block diagram illustrating one specific example of a waveform conversion unit of the numerically controlled oscillator of the second embodiment 2 of the invention. A configuration of a phase generation unit 41 in the numerically controlled oscillator can be the same as that of the embodiment 1. The configuration of the phase generation unit 41 is not limited to that.

The embodiment discloses a method for compressing the table by dividing the 360 degrees ($2\pi$ radian) phase section into eight pieces and converting and combining an input phase and output data in order to decrease pieces of data of each table and decrease the circuit scale. In the embodiment, an example is described in which a waveform conversion core unit which deals with only a 45 degrees ($\pi/4$ radian) phase section is used. However, even when a waveform conversion core unit which deals with a 90 degrees ($\pi/2$ radian) phase section or a 180 degrees ($\pi$ radian) phase section is used, there generates an advantage of decreasing in the circuit scale. Even in the embodiment, the phase signal generated in the phase generation unit 41 is 16 bits (ANGLE [15:0]).

As shown in FIG. 11, a waveform conversion unit 1042 includes a waveform conversion core unit 1001, a controller unit 1002, sign inversion circuits (NEG) 1003, 1006, 1007, and selectors (SEL) 1004, 1005. The waveform conversion unit 42 of the embodiment 1 is made to be a configuration which generates a cosine wave signal and a sine wave signal in a phase section from 0 to $\pi/4$ radian (waveform conversion core unit 1001), and the signs of the cosine wave signal and the sine wave signal in the phase section from 0 to $\pi/4$ radian are inverted and combined to generate a cosine wave signal waveform and a sine wave signal waveform from 0 to $2\pi$ radian. The configuration is therefore made, in which the sign inversion circuits 1003, 1006, 1007, selectors 1004, 1005 and the controller unit 1002 controlling those are added to the waveform conversion unit 1001 generating the cosine wave signal and the sine wave signal from the phase signal.

In the embodiment, a cosine signal and a sine signal each having a phase portion of $\pi/4$ radian which is one eighth of 2π radian are converted into signal waveforms corresponding to each section of eight sections. The sign inversion circuits 1003, 1006, 1007, selectors 1004, 1005 have to be controlled in accordance with what section which is one eighth of phase of 2π radian an input phase signal belongs to. Therefore, the controller unit 1002 uses high-order three bits of the input phase signal (ANGLE[15:13]), determines which section is the input phase signal, 0 to π/4, π/4 to π/2, π/2 to 3π/4, 3π/4 to π/2, π/2 to 5π/4, 5π/4 to 3π/2, 3π/2 to 7π/4, or 7π/4 to 2π radian, and generates control signals C0, C1, C2, C3 and C4. These control signals C0 to C4 are inputted to the sign inversion circuit 1003, the selector 1004, the selector 1005, the sign inversion circuit 1006, and the sign inversion circuit 1007, respectively, control the sign inversion or the selection, and configure the waveform conversion unit 1042 generating a waveform signal of 360 degrees (2π radian) phase section using the waveform conversion core unit generating only a waveform signal of 45 degrees (π/4 radian) phase section.

The waveform conversion core unit 1001 may generates any signal in the eight sections. However, the unit 1001 generates a cosine wave signal and a sine wave signal in the phase section of 0 to π/4 in the embodiment. The sign inversion circuit 1003 inverts the right and the left sides of the waveform signal, and the sign inversion circuit 1006 and the sign inversion circuit 1007 invert the upper and the lower sides of the waveform signal.

While the input phase signal (ANGLE[15:0]) is in 0 to π/4 radian, the sign inversion circuits 1003, 1006, and 1007 do not perform sign inversion, the selector 1004 selects a cosine wave signal (DC[18:0]), the selector 1005 selects a sine wave signal (DS[18:0]), and these are outputted as a cosine wave signal (DCOS[18:0]) and a sine wave signal (DSIN [18:0]), respectively, as they are.

While the input phase signal (ANGLE [15:0]) is in π/4 to π/2 radian, the sign inversion circuit 1003 performs horizontal inversion, the selector 1004 selects the sine wave signal (DS[18:0]), the sign inversion circuit 1006 do not perform inversion, and the sine wave signal (DS[18:0]) is outputted as the cosine wave signal (DCOS[18:0]). On the one hand, the selector 1005 selects the cosine wave signal (DC[18:0]), inversion is not performed in the sign inversion circuit 1007, and the cosine wave signal (DC[18:0]) is outputted as the sine wave signal (DSIN[18:0]).

While the input phase signal (ANGLE[15:0]) is in π/2 to 3π/4 radian, inversion is not performed in the sign inversion circuit 1003, the selector 1004 selects the sine wave signal (DS[18:0]), the sign inversion circuit 1006 inverts the sign thereof, and the vertically inverted signal is outputted as the cosine wave signal (DCOS[18:0]). The selector 1005 selects the cosine wave signal (DC[18:0]), sign inversion is not performed in the sign inversion circuit 1007, and the cosine wave signal (DC[18:0]) is outputted as the sine wave signal (DSIN[18:0]), as it is.

While the input phase signal (ANGLE[15:0]) is in 3π/4 to π radian, horizontal inversion is performed in the sign inversion circuit 1003, the selector 1004 selects the cosine wave signal (DC[18:0]), sign inversion is performed in the sign inversion circuit 1006, and the vertically inverted signal is outputted as the cosine wave signal (DCOS[18:0]). On the one hand, the selector 1005 selects the sine wave signal (DS[18:0]), inversion is not performed in the sign inversion circuit 1007, and the sine wave signal (DS[18:0]) is outputted as the sine wave signal (DSIN[18:0]), as it is.

If vertical inversion, horizontal inversion, a sine wave, and a cosine wave are combined, wave signals between π and 2π radian can be also generated. The configuration of the waveform conversion unit 1042 is not limited to the configuration shown in FIG. 11. In the embodiment, the configuration is described in which the sign inversion circuits 1006, 1007 are placed after the selectors 1004, 1005, respectively. However a configuration is possible in which it is placed just after the waveform conversion core unit 1001, that is, before the selector 1004.

Figure 12:
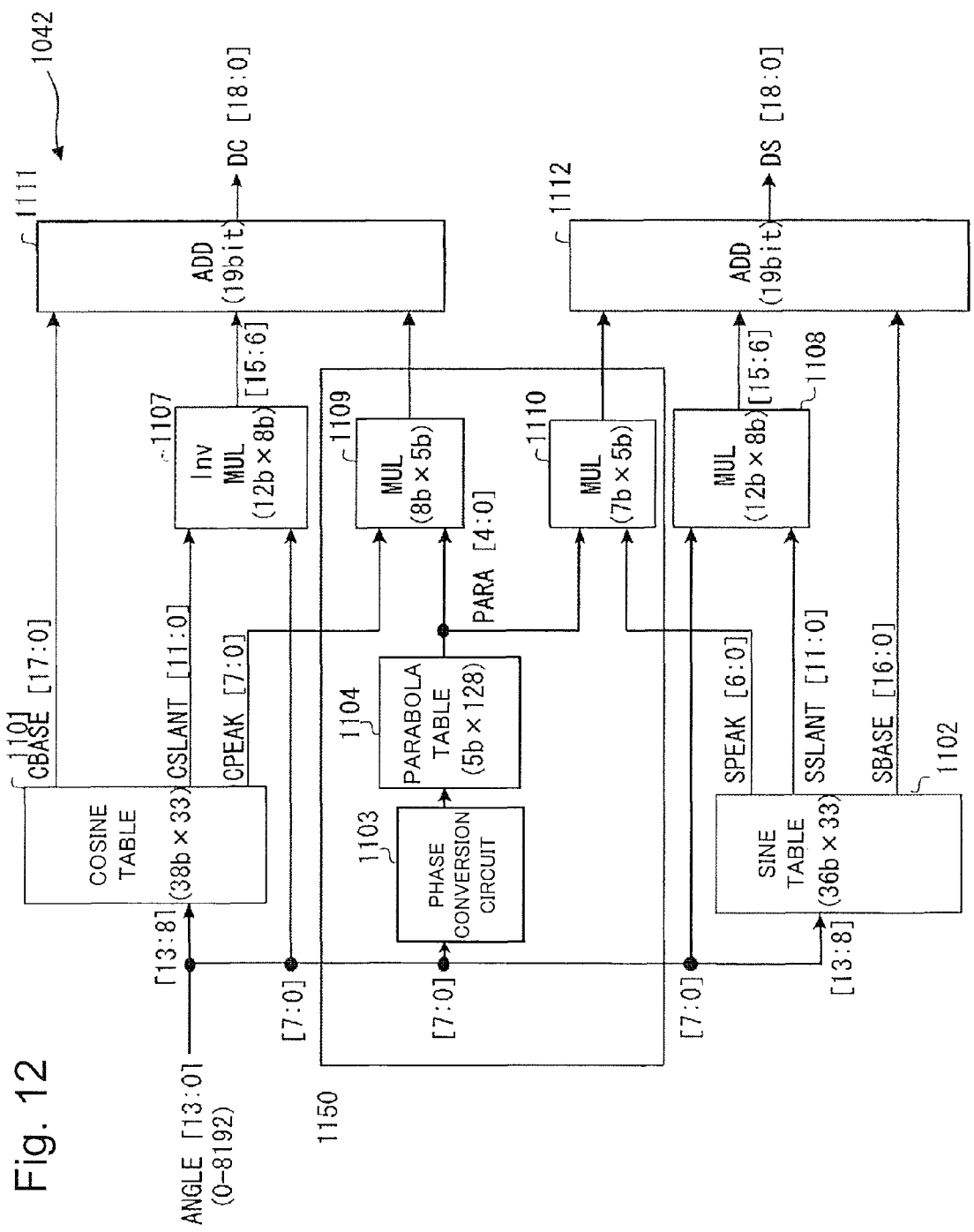
FIG. 12 is a block diagram illustrating a waveform conversion core unit of the embodiment 2 of the invention.

The wave form conversion core unit 1001 is described in detail. FIG. 12 is a block diagram illustrating the wave form conversion core unit 1001. The wave form conversion core unit 1001 receives a signal of low-order 14 bits in the input phase signal (ANGLE [15:0]).

The wave form conversion core unit 1001 includes a cosine table 1101, a sine table 1102, a phase conversion circuit 1103, a parabola table 1104, a multiplier 1107, a multiplier 1108, a multiplier 1109, a multiplier 1110, and an adder 1111, and corresponds to the configuration shown in FIG. 6 without the dividers 105, 106, and the adder 1111 and an adder 1112 are signal generators outputting the cosine wave signal and the sine wave signal, respectively. The phase conversion circuit 1103, the parabola table 1104, and the multipliers 1109, 1110 compose a correction mechanism 1050, and the multipliers 1109, 1110 compose a correction value output unit.

As described above, in the embodiment, the cosine wave signal (DC[18:0]) and the sine wave signal (DS[18:0]) in the phase section of 0 to 45 degrees (π/4 radian) are generated. If the input phase signal ANGLE is zero, 0 degree is indicated, and if the ANGLE is 8192, 45 degrees (π/4 radian) is indicated.

The wave conversion unit 1042 receives low-order 14 bits of 16 bits phase signal generated in the phase generation unit 41 as an input phase signal (ANGLE [13:0]). The input phase signal (ANGLE [13:0]) is decomposed into high-order 6 bits (ANGLE [13:8]) and low-order 8 bits (ANGLE [7:0]), the high-order 6 bits (ANGLE [13:8]) is inputted into the cosine table 1101 and the sine table 1102. The cosine table 1101 outputs a signal of 38 bits in all which includes 18 bits as a base value (CBASE [17:0]), 8 bits as a peak value (CPEAK [7:0]), and 12 bits as a gradient value (CSLANT [11:0]). Bit widths of the base value, the peak value, and the gradient value in the embodiment are guidelines of bit numbers to maintain necessary accuracy in each parameter, and are not limited to those. Bit widths may be set in response to meet requirements on accuracy, a circuit scale, or the like.

In the embodiment, the cosine table 1101 and the sine table 1102 include parameters corresponding to a phase value which is made by dividing the phase section of 0 to π/4 radian into 32. Therefore, phase interval G2 shown in FIG. 8=(π/4)/32 radian=π/128 radian. 33 tables are required in order to store the base value, the peak value and the gradient value in 32 phase sections, and therefore, in the example, the cosine table 1101 includes a size of total 38 bytes×33. Since 6 bytes or more is necessary in order to select the 33 tables, the high-order 6 bits (ANGLE [13:8]) are used.

The sine table 1102 is also similar. Although a gradient value (SSLANT [11:0]) of 12 bits is the same as that of the cosine table 1101, a base value (SBASE [16:0]) of 17 bits and a peak value (SPEAK [6:0]) of 7 bits are different from that of the cosine table 1101, required accuracy can be achieved by the bit width in the sine wave signal. As described above, the bit width of each parameter is not limited to that. Like the cosine table 1101, since 33 tables storing parameters of a phase interval in which is 0 to π/4 radian is divided into 32 sections is necessary, the sine table 1102 is 36 bits×33.

As described below, the phase conversion circuit 1103 receives, for example, a phase signal of low-order 7 bits and outputs a phase-converted phase signal of 6 bits. The phase conversion circuit 1103 converts an input phase signal of 0 to $2\pi$ radian into a phase signal of 0 to $\pi/4$ radian.

The parabolic waveform data of the parabola table 1104 also includes only a parabolic waveform data corresponding to 0 to $\pi/4$ radian. In the embodiment 1, the explanation is performed on left half (0 to N/2) of a laterally symmetrical parabola. In this embodiment, only data of left half (0 to N/4) thereof is available. In this description, the section is divided into 32 parts (phase interval G2), the phase interval G2 is further divided into 128 sections which have a phase interval G1, and the parabolic waveform data of the phase interval G1 is included. That is, phase interval $G1=(\pi/4)/32)/128$, $\pi/16384$ radian. A parabolic waveform data (PARA [4:0]) is outputted by 5 bits.

The multipliers 1107, 1108 multiply a gradient value of 12 bits and a phase signal of low-order 8 bits together and output a signal ([15:6] whose low-order 5 bits are deleted for normalization. Respective correction values which are multiplication results of the multipliers 1109, 1110 are outputted by 5 bits. Like the embodiment 1, the adders 1111, 1112 add the base values, the multiplication results of the multipliers 1109, 1110, and the correction values, and output the cosine wave signal (DC[18:0]) and the sine wave signal (DS[18:0]), respectively. Bit width of each arithmetic unit may be optionally determined from the point of view of a circuit scale and operation accuracy.

Figure 13:
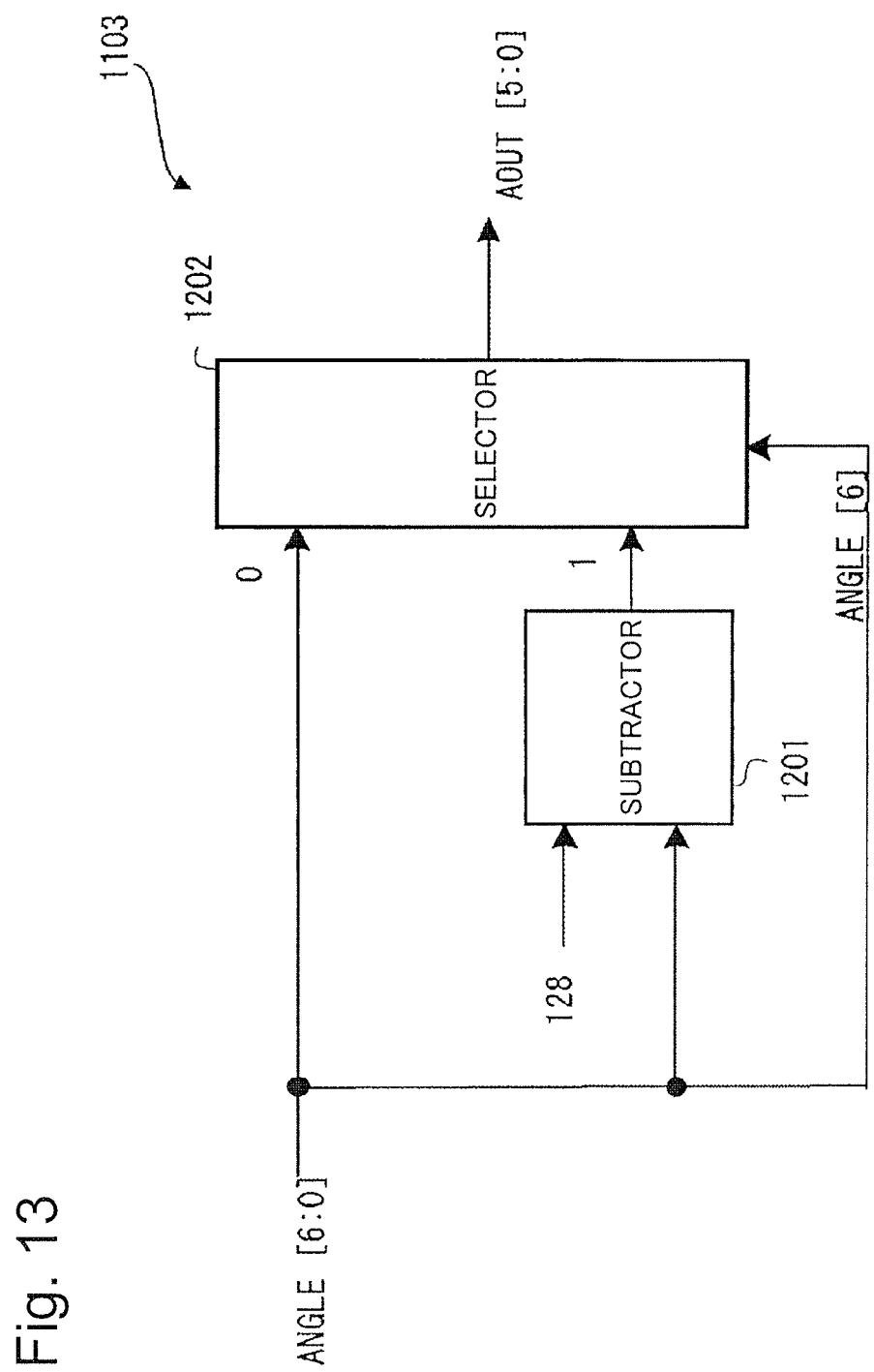
FIG. 13 is a diagram illustrating a phase conversion circuit of the embodiment 2 of the invention.

FIG. 13 is a diagram illustrating a phase conversion circuit of the embodiment. As shown in FIG. 13, the phase conversion circuit 1103 includes a subtracter 1201 and a selector 1202. Low order 5 bits are outputted, as they are, when the highest order bit (ANGLE[6]) of an input phase signal (ANGLE[6:0]) is zero, and low-order 5 bits of a value of 128 minus the input phase signal is outputted when the highest order bit is one.

In the waveform conversion core unit 1001 configured like this, by using an input signal (ANGLE [13:8]) of 6 bits, the base value (CBASE [17:0]), the peak value (CPEAK [7:0]), and the gradient value (CSLANT [11:0]) are outputted from the cosine table 1101. Similarly, by using an input signal (ANGLE [13:8]) of 6 bits, the base value (SBASE [17:0]), the peak value (SPEAK [7:0]), and the gradient value (SSLANT [11:0]) are outputted from the sine table 1102.

Next, the low-order bits of the input phase signal is phase-converted by the phase conversion circuit 1103, and the parabolic waveform data (PARA[4:0]) is taken from the parabola table 1104 using the result.

Next, a multiplier 1105 sign-inversion-multiplies the gradient value parameter (CSLANT [11:0]) for a cosine wave and the low-order bit (ANGLE [7:0]) of the input phase together. The sign-inversion-multiplication is performed, because a gradient value is negative in a phase section of 0 to $\pi/4$ radian in a cosine wave. The result of the sign-inversion-multiplication is outputted by deleting low-order 5 bits thereof. That is because a low-order bit portion of the input phase is normalized. Similarly, a multiplier 1106 multiplies the gradient value parameter (SSLANT [11:0]) for a sine wave and the low-order bit (ANGLE [7:0]) of the input phase together. The result of the multiplication is outputted by deleting low-order 5 bits for normalization.

Further the multiplier 1109 multiplies the peak value parameter (CPEAK [7:0]) for a cosine wave and the parabolic data (PARA[4:0]) together, and converts a peak value at a center phase value in a phase section into a value corresponding to a phase in the phase section to generate a correction value. Similarly, the multiplier 1110 multiplies the peak value parameter (SPEAK [6:0]) for a sine wave and the parabolic data (PARA[4:0]) together, and converts a peak value at a central phase value in a phase section into a value corresponding to a phase in the phase section to generate a correction value.

The adder 1111 adds the base value (CBASE [17:0]) for a cosine wave, the operation result of the multiplier 1107, and the operation result of the multiplier 1109 (correction value) to generate the cosine wave signal (DC[18:0]). Similarly, the adder 1110 adds the base value (SBASE [17:0]) for a sine wave, the operation result of the multiplier 1108, and the operation result of the multiplier 1110 (correction value) to generate the sine wave signal (DS[18:0]).

In the multiplier 1109, 1110 performing multiplication of parabolic data, since an operation bit number is small, the multiplier is small and a circuit scale to be added to a normal linear interpolation technique is small. Like the embodiment 1, using a common parabolic data and correcting a value of linear interpolation, if an operation error and processing delay are smaller than that of the linear interpolation system and accuracy is similar to that of the linear interpolation system at the same phase interval width G1, a numerically controlled oscillator whose circuit scale is reduced can be realized. If waveform signals of 0 to $\pi/4$ radian are combined and converted, the circuit scale can be largely reduced while keeping accuracy compared with the embodiment 1.

The invention of the present application is not limited to the above mentioned embodiments. It is to be understood that to the configurations and details of the invention of the present application, various changes can be made within the scope of the invention of the present application.

Though the above embodiment describes the hardware configuration, it is not limited to that and a part of or all of arbitrary processing may be achieved by causing a CPU (Central Processing Unit) to execute a computer program. In this case, the computer program can be stored in various types of non-transitory computer readable media and supplied to a computer. The non-transitory computer readable media includes various types of tangible storage media. The non-transitory computer readable media include, for example, magnetic storage media (e.g. flexible disc, magnetic tape, or hard disc drive), magneto-optical storage media (e.g. magneto-optical disc), CD-ROM (Read Only Memory), CD-R, CD-R/W, semiconductor memory (e.g. mask ROM, PROM (Programmable ROM), EPROM (Erasable PROM), flash ROM, or RAM (random access memory)). The program may be supplied to a computer by various types of the transitory computer readable media. Examples of the transitory computer readable media include an electric signal, an optical signal, and an electromagnetic wave. The transitory computer readable media can supply a program to a computer through a cable communication path, like an electric wire, an optical fiber, or a wireless communication path.

Though being described based on the above embodiment, the inventions are not limited to the above embodiment. It is to be understood that to the configurations and details of the invention of the present application, various changes can be made within the scope of the invention of the present application by those skilled in the art.

This application claims priority from Japanese Patent Application No. 2012-272523, filed on Dec. 13, 2012, and the contents of which are incorporation herein by reference in their entirety.

This application is based upon and claims the benefit of priority from Japanese Patent Application No. 2012-272523, filed on Dec. 13, 2012, the disclosure of which is incorporated herein in its entirety by reference.

REFERENCE SIGNS LIST 1 wireless signal processing unit
11 orthogonal demodulation processing unit
12 orthogonal modulation processing unit
40 numerically controlled oscillator
41 phase generation unit
42 waveform conversion unit
50 correction mechanism
101 cosine table
102 sine table
103 phase conversion circuit
104 parabola table
105, 106 divider
107, 108, 109, 110 multiplier
111, 112 adder
202, 203 multiplier
204, 205 filter
302, 302 multiplier
304 adder
901 phase rotation speed register
903 adder
1001 waveform conversion core unit
1002 controller unit
1003 sign inversion circuit
1004, 1005 selector
1006, 1007 sign inversion circuit
1042 waveform conversion unit
1050 correction mechanism
1101 cosine table
1102 sine table
1103 phase conversion circuit
1104 parabola table
1107, 1108, 1109, 1110 multiplier
1111, 1112 adder
1201 subtractor
1202 selector
1301 cosine table
1302 sine table
1303, 1304 divider
1305, 1306 multiplier
1307, 1308 adder

The invention claimed is:

1. A signal generator, comprising:
a first parameter table that stores a parameter to generate a first frequency signal;
a second parameter table that stores a parameter to generate a second frequency signal that differs in a phase from the first frequency signal;
correction value generation unit, that a phase signal generated at a first phase interval is inputted to, for generating first and second correction values correcting the first and the second frequency signals in accordance with a phase indicated by the phase signal, respectively;
first signal generation unit for generating the first frequency signal of the first phase interval on the basis of the phase signal, the parameter of the first parameter table, and the first correction value generated by the correction value generation unit; and
second signal generation unit for generating the second frequency signal of the first phase interval on the basis of the phase signal, the parameter of the second parameter table, and the second correction value generated by the correction value generation unit;
wherein the first and the second frequency signals are a sine wave signal and a cosine wave signal, respectively,
wherein the first and the second parameter tables hold parameters to generate the first and the second frequency signals by linear interpolation in a second phase interval that is an interval larger than the first phase interval, and
wherein each of the first and the second parameter tables comprise a first, a second, and a third parameters,
the first parameter indicates a corresponding data value of the first or the second frequency signal at the minimum phase in a second phase interval that is an interval larger than the first phase interval,
the second parameter indicates a gradient value of an interpolation straight line that is a straight line connecting between corresponding data values of the first or the second frequency signal at the minimum phase and the maximum phase in the second phase interval, and
the third parameter indicates a difference between a value on the interpolation straight line and a corresponding value on the first or the second frequency signal, at an intermediate phase value in the second phase interval.

2. The signal generator according to claim 1, wherein the correction value generation unit comprises a parabolic waveform table having waveform data of a phase interval that is smaller than the second phase interval, the wave data being a laterally symmetrical parabolic waveform, and the correction value generation unit refers to the parabolic waveform table and generates the first and the second correction values corresponding to a phase interval that is equal to or larger than the first phase interval and smaller than the second phase interval.

3. The signal generator according to claim 2, wherein the parabolic waveform table comprises the waveform data of only the right or the left half of the parabolic waveform.

4. The signal generator according to claim 1, wherein the correction value generation unit comprises:
the parabolic waveform table having waveform data of the phase interval that is smaller than the second phase interval that is an interval larger than the first phase interval, the wave data being the laterally symmetrical parabolic waveform;
a phase conversion circuit that converts the phase signal into a value corresponding to a phase of the waveform data stored in the parabolic waveform table; and
first and second correction value output unit for generating the first and the second correction values of the phase interval that is smaller than the second phase interval on the basis of the waveform data that is read out from the parabolic waveform table in accordance with the phase that is phase-converted and the third parameter, respectively.

5. The signal generator according to claim 4, wherein, when periods of the first and the second frequency signals are $2\pi$ and the phase signal of the first phase interval is represented as $22n=2N$ bits ($N \geq 0$, n is an integer equal to or greater than 0), the first and the second parameter tables store parameters of the second phase interval to generate the first and the second frequency signals in 0 to $\pi/4$, respectively, and the parabolic waveform table stores a value of the first phase interval in 0 to N/4 of a horizontal axis in the laterally symmetrical parabola in 0 to 1 of a vertical axis and 0 to N of the horizontal axis.

* * * * *